(12) United States Patent
Lee et al.

(10) Patent No.: US 11,129,281 B2
(45) Date of Patent: Sep. 21, 2021

(54) FLEXIBLE CIRCUIT FILM AND ELECTRONIC DEVICE COMPRISING THE SAME

(71) Applicant: LG Display Co., Ltd., Seoul (KR)

(72) Inventors: Junjae Lee, Paju-si (KR); Kwangju Lee, Paju-si (KR); Myeongah Shin, Paju-si (KR); Dohyun Kwon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 20 days.

(21) Appl. No.: 16/568,745

(22) Filed: Sep. 12, 2019

(65) Prior Publication Data
US 2020/0137890 A1    Apr. 30, 2020

(30) Foreign Application Priority Data
Oct. 29, 2018   (KR) .......................... 10-2018-0130013

(51) Int. Cl.
| | | |
|---|---|---|
| *H05K 1/00* | (2006.01) | |
| *H05K 1/18* | (2006.01) | |
| *H05K 3/38* | (2006.01) | |
| *H05K 3/28* | (2006.01) | |
| *H05K 3/46* | (2006.01) | |

(52) U.S. Cl.
CPC ............... *H05K 1/189* (2013.01); *H05K 3/28* (2013.01); *H05K 3/386* (2013.01); *H05K 3/46* (2013.01)

(58) Field of Classification Search
CPC .......... H05K 1/189; H05K 3/386; H05K 3/28; H05K 3/46; H05K 1/028; H05K 1/147; H05K 2201/10128; G06F 1/1637; G06F 1/1652; H04M 1/0202
See application file for complete search history.

(56) References Cited

U.S. PATENT DOCUMENTS

| | | | |
|---|---|---|---|
| 10,490,504 B2* | 11/2019 | Jo ........................ | H01L 23/5385 |
| 2009/0296330 A1* | 12/2009 | Ho ........................ | H05K 1/0219 361/679.4 |
| 2014/0042406 A1* | 2/2014 | Degner ............... | H01L 27/3297 257/40 |
| 2014/0217382 A1* | 8/2014 | Kwon ................. | H01L 51/5246 257/40 |
| 2016/0275830 A1* | 9/2016 | You .................... | G02F 1/133305 |
| 2017/0215288 A1* | 7/2017 | Shi ....................... | H01L 27/3276 |
| 2018/0069067 A1* | 3/2018 | Oh ......................... | H05K 1/181 |

FOREIGN PATENT DOCUMENTS

| | | | |
|---|---|---|---|
| JP | 101092987 | * | 12/2011 |
| KR | 10-2007-0012077 A | | 1/2007 |
| KR | 10-1092987 B1 | | 12/2011 |
| KR | 10-2018-0011443 A | | 2/2018 |

\* cited by examiner

*Primary Examiner* — Yuriy Semenenko
(74) *Attorney, Agent, or Firm* — Seed IP Law Group LLP (57) ABSTRACT

A flexible circuit film, which is capable of preventing broken portions during an assembly process, and an electronic device comprising the same is disclosed. The flexible circuit film comprises a bonding pad portion, a body portion, and a film bending portion between the bonding pad portion and the body portion, wherein at least some portion of the film bending portion has a thickness that is less than a thickness of the body portion.

18 Claims, 5 Drawing Sheets

FLEXIBLE CIRCUIT FILM AND ELECTRONIC DEVICE COMPRISING THE SAME

CROSS-REFERENCE TO RELATED APPLICATION

This application claims the benefit of the Korean Patent Application No. 10-2018-0130013 filed on Oct. 29, 2018, which is hereby incorporated by reference, in its entirety.

BACKGROUND

Technical Field

The present disclosure relates to a flexible circuit film and an electronic device comprising the same, and more particularly, to a flexible circuit film capable of being bent, and an electronic device comprising the same.

Description of the Related Art

Generally, an electronic device such as a television, a monitor, a notebook computer, a smart phone, a tablet computer, an electronic pad, a wearable device, a smart watch, a mobile information device, a navigation device, or a vehicle control display device are realized in a multimedia player having complex functions, including image displaying, photo shooting or video recording, audio or video file playing, gaming, or broadcasting receiving.

The electronic device may include a housing, a display module received in the housing, a flexible circuit film connected with the display module, and a cover window configured to cover the display module. The flexible circuit film may be bent from a rear surface of the display module while being configured to surround a lateral surface of the display module, to thereby reduce a bezel width of the electronic device.

In the case of general electronic devices, the flexible circuit film is not easily bent due to a bending repulsive force or a bending resistive force of the flexible circuit film, and uneven surface portions may be generated in the flexible circuit film. Also, broken portions may be generated in the flexible circuit film due to interference between a lower end of the flexible circuit film and a sidewall of the cover window during an assembly process of the electronic device, which may cause cracks on the flexible circuit film, or bonding defects between the flexible circuit film and the display module.

The above content of the background technology may be useful for a deduction of the present disclosure by inventors, or may be technology information learned by practice of embodiments of the present disclosure. However, the above content of the background technology may not be prior art published to the general public before the filing date of the present disclosure.

BRIEF SUMMARY

The present disclosure has been made in view of the above problems in the art, and one or more embodiments of the present disclosure provide a flexible circuit film capable of preventing broken portions during an assembly process, and an electronic device comprising the same.

One or more embodiments of the present disclosure provide a flexible circuit film capable of reducing a bending repulsive force or a bending resistive force, and an electronic device comprising the same.

In accordance with one or more embodiments of the present disclosure, the above and other objects can be accomplished by the provision of a flexible circuit film comprising a bonding pad portion, a body portion, and a film bending portion between the bonding pad portion and the body portion, wherein at least some portion of the film bending portion has a thickness that is less than a thickness of the body portion.

In accordance with one or more embodiments of the present disclosure, there is provided an electronic device comprising a cover window, and a display module connected with the cover window, wherein the display module includes a touch flexible circuit film bonded to a touch pad portion, and the touch flexible circuit film includes a bonding pad portion, a body portion, and a film bending portion between the bonding pad portion and the body portion, wherein at least some portion of the film bending portion has a thickness that is less than a thickness of the body portion.

According to one or more embodiments of the present disclosure, it is possible to prevent defects caused by the forcible bending of the flexible circuit film for the assembly process, and furthermore, to prevent uneven surface portions of the flexible circuit film from forming due to the bending repulsive force of the flexible circuit film.

In addition to the embodiments of the present disclosure as mentioned above, additional embodiments of the present disclosure will be clearly understood by those skilled in the art from the following description of the present disclosure.

BRIEF DESCRIPTION OF THE DRAWINGS

The above and other embodiments, features and other advantages of the present disclosure will be more clearly understood from the following detailed description taken in conjunction with the accompanying drawings, in which.

DETAILED DESCRIPTION

Advantages and features of the present disclosure, and implementation methods thereof will be clarified through explanation of the following embodiments described with reference to the accompanying drawings. The present disclosure may, however, be embodied in different forms and should not be construed as limited to the embodiments set forth herein. Rather, the below embodiments are provided so that this disclosure will be thorough and complete, and will fully convey the scope of the present disclosure to those skilled in the art. Further, the present disclosure is only defined by the scope of claims.

In some embodiments, a shape, a size, a ratio, an angle, and a number disclosed in the drawings for describing embodiments of the present disclosure are merely exemplary in nature, and thus, the present disclosure is not limited to the illustrated details.

In other embodiments, certain shapes, sizes, ratios, angles, and numbers shown in the drawings are drawn to scale. Like reference numerals refer to like elements throughout the specification and the accompanying drawings. In the following description, when the detailed description of a relevant known function or configuration is determined to unnecessarily obscure the present disclosure, such detailed description will be omitted. However, it is to be appreciated that the scope of the present disclosure includes such known function or configurations.

Where the terms "comprise," "have," and "include" are used in the present specification, another part may be added unless "only" is used in relationship with such terms. The terms of a singular form may include plural forms unless the context clearly dictates otherwise.

In construing numbers, dimensions, or elements, such numbers, dimensions, and elements should be construed as including an error range although there is no explicit description, unless the context dictates otherwise. For example, in some embodiments, the error range is within 5% of the number, dimension, or element stated.

In describing a position relationship, for example, when the position relationship is described as "upon," "above," "below," and "next to," one or more portions may be arranged between two other such portions unless "just" or "direct" is used.

In describing a time relationship, for example, when the temporal order is described as "after," "subsequent," "next," and "before", an embodiment which is not continuous may be included unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, etc., without departing from the scope of the present disclosure.

It should be also be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or completely coupled to or combined with each other, and may be inter-operated with each other and driven technically as those skilled in the art can sufficiently understand. The embodiments of the present disclosure may be carried out independently from each other, or may be carried out together in a co-dependent relationship.

Hereinafter, a flexible display module according to embodiments of the present disclosure and an electronic device comprising the same will be described in detail with reference to the accompanying drawings.

Figure 1:
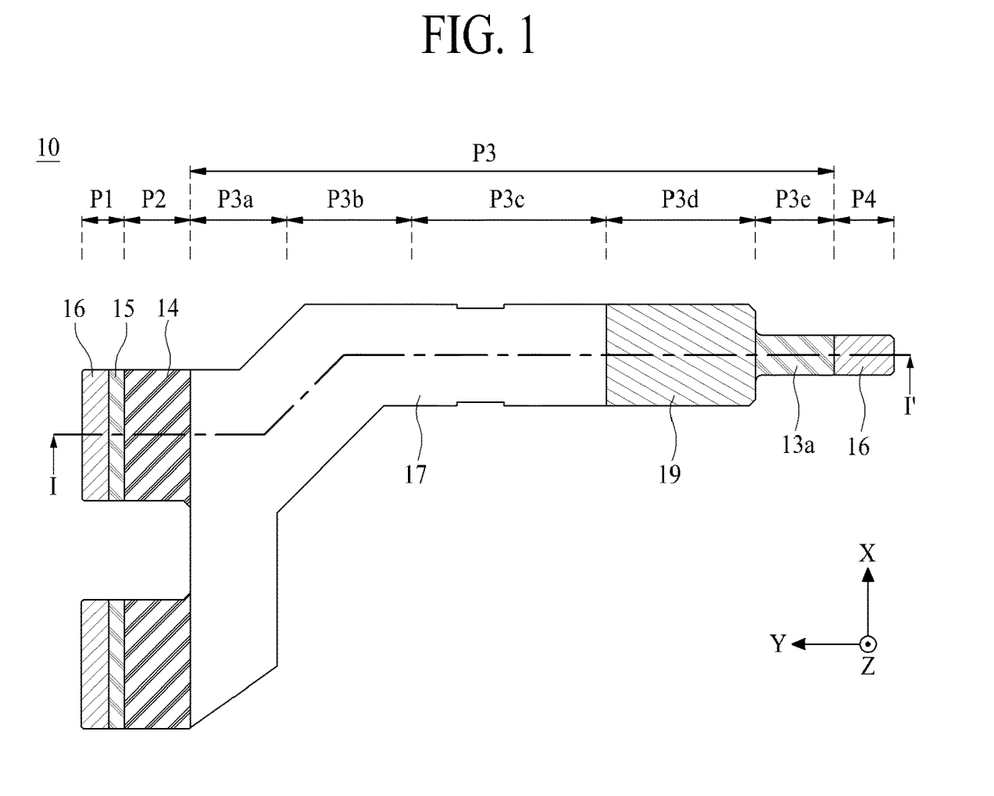
FIG. 1 is a plan view illustrating a flexible circuit film according to one embodiment of the present disclosure.
Figure 2:
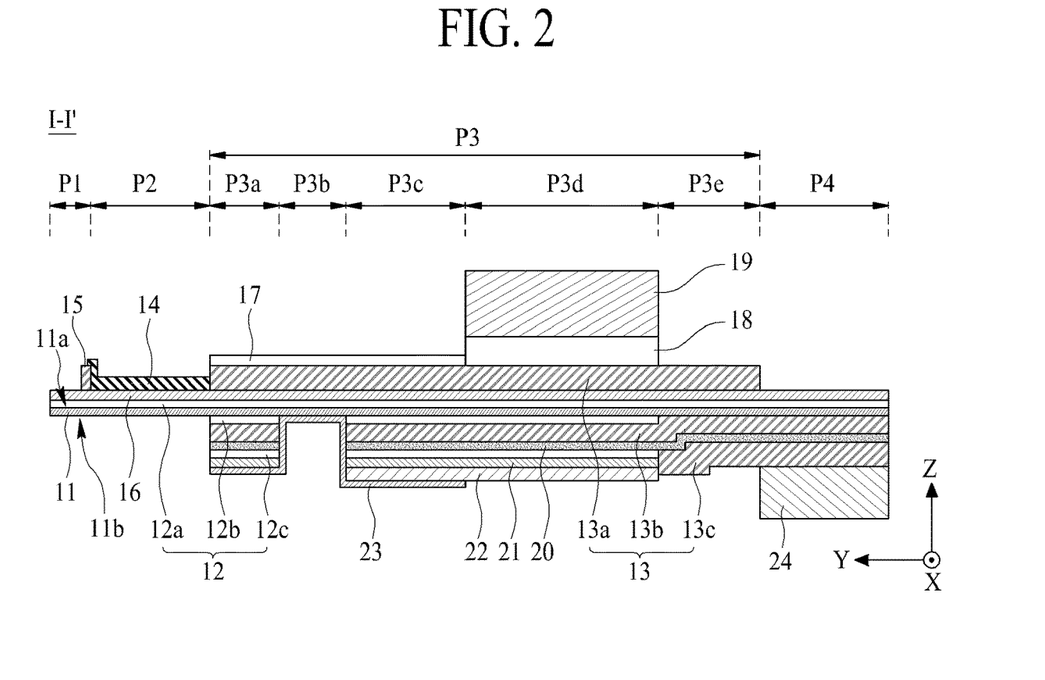
FIG. 2 is a cross-sectional view of the flexible circuit film of FIG. 1 along I-I' in FIG. 1.

FIG. 1 is a plan view illustrating a flexible circuit film 10 according to one embodiment of the present disclosure. FIG. 2 is a cross sectional view of the flexible circuit film 10 along I-I' in FIG. 1.

Referring to FIGS. 1 and 2, the flexible circuit film 10 according to one embodiment of the present disclosure includes a structure capable of preventing bent or broken portions during an assembly process or reducing a bending resistive force (which may be referred to herein as a bending repulsive force) of the flexible circuit film 10. The flexible circuit film 10 according to one embodiment of the present disclosure includes at least one bonding pad portion (P1), a body portion (P3), and a film bending portion (P2) connected between the body portion (P3) and the at least one bonding pad portion (P1). In the embodiment illustrated in FIG. 1, there are two bonding pad portions (P1), although it is to be appreciated that embodiments of the present disclosure include flexible circuit films with more or less than two bonding pad portions (P1). At least some portion of the film bending portion (P2) preferably has a smaller thickness than a thickness of the body portion (P3) so that it is possible to prevent the flexible circuit film 10 from being bent or broken during the assembly process or to reduce the bending repulsive force of the bent flexible circuit film 10.

Each of the at least one bonding pad portion (P1), the film bending portion (P2), and the body portion (P3) may have a multi-layered structure, as shown more clearly in FIG. 2. In one embodiment, the number of layers included in at least some portion of the film bending portion (P2) is less than the number of layers included in the body portion (P3). For example, at least some portion of the film bending portion (P2) may have a multi-layered structure comprising less than or equal to four layers, and the body portion (P3) may have a multi-layered structure comprising greater than or equal to five layers, in at least one embodiment.

The at least one bonding pad portion (P1) may be electrically connected with a touch pad portion or a display pad portion of a display module, as described herein. For example, in one embodiment, the at least one bonding pad portion (P1) is electrically connected with the touch pad portion or the display pad portion of the display module by a film attachment process using an anisotropic conductive film.

The body portion (P3) corresponds to a body of the flexible circuit film 10 having a predetermined length, wherein the body portion (P3) includes circuit lines and circuit components. In accordance with a length of the flexible circuit film 10, the body portion (P3) according to one embodiment of the present disclosure may include first, second, and third body portions (P3a, P3b, P3c), an electronic component mounting portion (P3d), and a fourth body portion (P3e). The electronic component mounting portion (P3d) may include various electronic components (or circuit) mounted by a surface mounting technology in different embodiments.

The film bending portion (P2), which is disposed between the at least one bonding pad portion (P1) and the first body portion (P3a) of the body portion (P3), enables bending of the flexible circuit film 10, as described further herein.

The flexible circuit film 10 according to one embodiment of the present disclosure further includes a connector portion (P4). The connector portion (P4) extends from the fourth body portion (P3e) of the body portion (P3), and is electrically connected with a printed circuit board of an electronic device.

Turning to FIG. 2 with continued reference to FIG. 1, the flexible circuit film 10 according to one embodiment of the present disclosure includes a base member 11, a circuit line layer 12, a cover layer 13, and a coating layer 14.

The base member 11 is disposed overlapping with each of the at least one bonding pad portion (P1), the film bending portion (P2), the body portion (P3), and the connector portion (P4) included in the flexible circuit film 10. That is, the base member 11 includes an area corresponding to each of the at least one bonding pad portion (P1), the film bending portion (P2), the body portion (P3), and the connector portion (P4). In other words, in one embodiment, the base member 11 extends along an entire length of the flexible circuit film 10 between outermost distal edges of the base member 11 such that the flexible circuit film 10 includes an area corresponding to each of the at least one bonding pad portion (P1), the film bending portion (P2), the body portion (P3), and the connector portion (P4). In one or more embodiments, the base member 11 is a plastic film, for example, a polyimide (PI) film.

The circuit line layer 12 is disposed on at least one of a first surface 11a (which may be referred to herein as a front or top surface 11a) and a second surface 11b (which may be referred to herein as a rear or bottom surface 11b) of the base member 11, as shown in FIG. 2. The circuit line layer 12 preferably has a copper clad lamination structure or a flexible copper clad lamination structure.

The circuit line layer 12 according to one embodiment of the present disclosure includes a first circuit line layer 12a disposed on the first surface 11a of the base member 11. In one embodiment, the first circuit line layer 12a is disposed on an entirety of the first surface 11a of the base member 11.

The first circuit line layer 12a preferably has the copper clad lamination or flexible copper clad lamination structure and includes a plurality of first circuit lines disposed on the first surface 11a of the base member 11. In other words, because the first circuit line layer 12a is disposed on the entirety of the first surface 11a of the base member 11 in an embodiment, the first circuit line layer 12a overlaps with each of the at least one bonding pad portion (P1), the film bending portion (P2), the body portion (P3), and the connector portion (P4) of the flexible circuit film 10. As such, the first circuit line layer 12a has an area corresponding to each of the at least one bonding pad portion (P1), the film bending portion (P2), the body portion (P3), and the connector portion (P4) of the flexible circuit film 10.

The first circuit line layer 12a according to one embodiment of the present disclosure includes a copper clad layer attached to the first surface 11a of the base member 11 by the use of an adhesive layer, whereby the first circuit line layer 12a has a dual-layered structure comprising the adhesive layer and the copper clad layer. In an alternative embodiment, the first circuit line layer 12a has a deposition structure (or connection structure) comprising the adhesive layer and the copper clad layer that is considered as one single layer.

The first circuit line layer 12a according to another embodiment of the present disclosure includes an adhesive layer attached to the first surface 11a of the base member 11, a plurality of copper clad layers disposed on the adhesive layer, and an insulating layer (or insulating adhesive layer) interposed between each of the copper clad layers. In this embodiment, the first circuit line layer 12a is considered as one layer, while in other embodiments, the first circuit line layer 12a with such a structure is referred to as a multi-layer structure.

The circuit line layer 12 according to one embodiment of the present disclosure further includes a second circuit line layer 12b and a third circuit line layer 12c disposed on the second surface 11b of the base member 11.

The second circuit line layer 12b preferably has the copper clad lamination or flexible copper clad lamination structure and includes a plurality of second circuit lines disposed on the second surface 11b of the base member 11. In one embodiment, the second circuit line layer 12b extends along the base member 11 in the first body portion (P3a), the third body portion (P3c), and the electronic component monitoring portion (P3d) of the body portion (P3). Because the second circuit line layer 12b is disposed on the second surface 11b of the base member 11 overlapping with each of the first body portion (P3a), the third body portion (P3c), and the electronic component mounting portion (P3d) of the body portion (P3), the second circuit line layer 12b has an area corresponding to each of the first body portion (P3a), the third body portion (P3c), and the electronic component mounting portion (P3d) of the body portion (P3). In one or more embodiments, the second circuit line layer 12b is disposed in the electronic component mounting portion (P3d) of the body portion (P3), and is additionally disposed in at least one among the first to fourth body portions (P3a, P3b, P3c, P3e) of the body portion (P3) in according to a selected circuit structure of the flexible circuit film 10.

The second circuit line layer 12b according to one embodiment of the present disclosure includes a copper clad layer attached to the second surface 11b of the base member 11 by the use of an adhesive layer, whereby the second circuit line layer 12b has a dual-layered structure comprising the adhesive layer and the copper clad layer. The second circuit line layer 12b may also have a deposition structure (or connection structure) comprising the adhesive layer and the copper clad layer that is considered as one layer.

The second circuit line layer 12b according to another embodiment of the present disclosure includes an adhesive layer attached to the second surface 11b of the base member 11, a plurality of copper clad layers disposed on the adhesive layer, and an insulating layer (or insulating adhesive layer) interposed between each of the copper clad layers. In such an embodiment, the second circuit line layer 12b may be considered as one layer, while in other embodiments, the second circuit line layer 12b is referred to as a multi-layer structure.

Additionally, at least some of the plurality of second circuit lines disposed in the second circuit line layer 12b are electrically connected with at least one of the plurality of first circuit lines disposed in the first circuit line layer 12a through a via hole or contact hole penetrating through the base member 11.

The third circuit line layer 12c has the copper clad lamination or flexible copper clad lamination structure and includes a plurality of third circuit lines disposed on the second circuit line layer 12b.

The third circuit line layer 12c according to one embodiment of the present disclosure includes a copper clad layer disposed on the second circuit line layer 12b by an adhesive layer, whereby the third circuit line layer 12c has a dual-layered structure comprising the adhesive layer and the copper clad layer. In one embodiment, the third circuit line layer 12c has a deposition structure (or connection structure) comprising the adhesive layer and the copper clad layer, which may be considered as one layer. In one or more embodiments, the third circuit line layer 12c is disposed on an entirety of the second circuit line layer 12b such that the third circuit line layer 12c has areas corresponding to each of the first body portion (P3a), the third body portion (P3c), and the electronic component mounting portion (P3d) of the body portion (P3). In one or more embodiments, the third circuit line layer 12c is disposed in the electronic component mounting portion (P3d) of the body portion (P3), and is additionally disposed in at least one among the first to fourth body portions (P3a, P3b, P3c, P3e) of the body portion (P3)

in according to a selected circuit structure of the flexible circuit film 10. As such, an area of the third circuit line layer 12*c* preferably corresponds to an area of the second circuit line layer 12*b*, although in other embodiments, the areas of the second and third circuit line layers 12*b*, 12*c* are different and correspond to different portions of the flexible circuit film 10.

The third circuit line layer 12*c* according to another embodiment of the present disclosure includes an adhesive layer disposed on the second circuit line layer 12*b*, a plurality of copper clad layers disposed on the adhesive layer, and an insulating layer (or insulating adhesive layer) interposed between each of the copper clad layers. In such an embodiment, the third circuit line layer 12*c* may be considered as one layer, while in other embodiments, the third circuit line layer 12*c* with such a structure is referred to as a multi-layer structure.

Additionally, at least some of the plurality of third circuit lines disposed in the third circuit line layer 12*c* are electrically connected with at least one of the plurality of first circuit lines disposed in the first circuit line layer 12*a* through at least some of the plurality of second circuit lines disposed in the second circuit line layer 12*b* and/or by a via hole or contact hole penetrating through the second circuit line layer 12*b* and the base member 11.

The cover layer 13 is disposed on the circuit line layer 12 to thereby prevent the circuit line layer 12 from being exposed to the external environment and harmful contaminants.

The cover layer 13 according to one embodiment of the present disclosure includes a first cover layer 13*a* configured to cover the first circuit line layer 12*a* disposed on the first surface 11*a* of the base member 11. As such, in one embodiment, the first cover layer 13*a* corresponds to the body portion (P3) and covers (or is disposed on) an area of the first surface 11*a* of the base member 11 corresponding to the body portion (P3).

The first cover layer 13*a* has a dual-layered structure in an embodiment, comprising a cover film and an adhesive layer coated onto one surface of the cover film. This dual-layered structure of the first cover layer 13*a* may also be referred to herein as one layer. The first cover layer 13*a* is attached onto the first circuit line layer 12*a* disposed on the first surface 11*a* of the base member 11 through the use of the adhesive layer in an area of the first circuit line layer 12*a* and the base member 11 corresponding to the body portion (P3), to thereby protect or insulate the otherwise exposed surface of the first circuit line layer 12*a*. In one embodiment, the first cover layer 13*a* is a complex film comprising a PI film, and a thermo-curing epoxy adhesive coated onto one surface of the PI film. In another embodiment, the first cover layer 13*a* is a complex film comprising a PI film, a thermo-curing epoxy adhesive coated onto one surface of the PI film, and a black adhesive (or black PI film) formed on the other surface of the PI film.

The cover layer 13 according to one embodiment of the present disclosure further includes a second cover layer 13*b* configured to cover the second circuit line layer 12*b* disposed on the second surface 11*b* of the base member 11 corresponding to the body portion (P3). The second cover layer 13*b* may have the same or a similar structure as that of the first cover layer 13*a*, except the second cover layer 13*b* may have a thickness that is less than a thickness of the first cover layer 13*a*, in addition to other differences described herein. Additionally, the second cover layer 13*b* is additionally disposed in the connector portion (P4) and the fourth body portion (P3*e*) of the body portion (P3) in which the second circuit line layer 12*b* is not disposed, in an embodiment. That is, the second cover layer 13*b* is disposed on the second circuit line layer 12*b* corresponding to the remaining portions (P3*a*, P3*c*, P3*d*, P3*e*) of the body portion (P3) except the second body portion (P3*b*), and is also disposed on the second surface 11*b* of the base member 11 corresponding to the connector portion (P4).

The cover layer 13 according to one embodiment of the present disclosure further includes a third cover layer 13*c* disposed on the second surface 11*b* of the base member 11 overlapped with the connector portion (P4) and the fourth body portion (P3*e*) of the body portion (P3). In other words, the third cover layer 13*c* has an area on the second surface 11*b* of the base member 11 that corresponds to the connector portion (P4) and the fourth body portion (P3*e*) of the body portion (P3). The third cover layer 13*c* is identical in structure to the first cover layer 13*a*, in an embodiment, while in other embodiments, the structure of the third cover layer 13*c* is different.

The coating layer 14 is coated and cured onto the first surface 11*a* of the base member 11 corresponding with at least some portions of the film bending portion (P2). The coating layer 14 covers the first circuit line layer 12*a* of the circuit line layer 12 disposed on the film bending portion (P2) so as to protect or insulate the exposed surface of the first circuit line layer 12*a* which is not covered by the cover layer 13. In one embodiment, the coating layer 14 is on an area of the base member 11 corresponding to an entirety of the film bending portion (P2), while in other embodiments, the coating layer 14 is on an area of the base member 11 corresponding to more or less than the entirety of the film bending portion (P2).

When the coating layer 14 is provided in at least some portions of the film bending portion (P2), the thickness in at least some portions of the film bending portion (P2) is preferably less than the thickness of the body portion (P3). In other words, a thickness of the film bending portion (P2), which includes the base member 11, the first circuit line layer 12*a*, a support plate 16, and the coating layer 14 is less than a thickness of the body portion (P3) including at least the base member 11, the first circuit line layer 12*a*, the support plate 16, and the first cover layer 13*a*. In one embodiment, the body portion (P3) includes additional layers as well, as described herein. Moreover, in one embodiment, the difference in thickness between the film bending portion (P2) and the body portion (P3) can be attributed, at least in part, to a difference in thickness between the coating layer 14 and the first cover layer 13*a*, wherein the coating layer 14 has a thickness that is less than a thickness of the first cover layer 13*a*, with the thickness of the remaining layers (e.g. the base member 11, the first circuit line layer 12*a*, and the base plate 16) remaining constant between the film pending portion (P2) and the body portion (P3). Thus, it is possible to prevent the flexible circuit film 10 from being forcibly bent or broken during an assembly process, or to reduce a bending repulsive force of the flexible circuit film 10 when bent.

The thickness of the coating layer 14 according to one embodiment of the present disclosure is less than the thickness of the cover layer 13. That is, the thickness of the coating layer 14 is less than the thickness of each of the first, second, and third cover layers 13*a*, 13*b* and 13*c*. For example, the thickness of the coating layer 14 is greater than a minimum thickness capable of protecting or insulating the exposed surface of the first circuit line layer 12*a*, and is less than the thickness of the first cover layer 13*a*. In one or more embodiments, the coating layer 14 has a thickness of 5 µm (micrometers or microns) or more than 5 μm. In another embodiment, in the film bending portion (P2), a first height from the first surface 11a of the base member 11 to an uppermost surface of the coating layer 14 is less than a second height from the first surface 11a of the base member 11 to an uppermost surface of the first cover layer 13a.

Based on experimental results, the bending repulse force of the film bending portion (P2) according to a first experimental example, in which the coating layer 14 has a thickness of 20 μm formed in at least some portions of the film bending portion (P2), is reduced by 23% in comparison to the bending repulse force of the film bending portion (P2) according to a second experimental example, in which the first cover layer 13a having a thickness of 37.5 μm is formed in at least some portions of the film bending portion (P2).

The coating layer 14 according to one embodiment of the present disclosure is formed of an insulating material capable of protecting or insulating the exposed surface of the first circuit line layer 12a. For example, the coating layer 14 may include a PI material or solder resist material in various embodiments.

The flexible circuit film 10 according to the present disclosure may further include a partition 15 configured to minimize an overflow of some of the insulating material (or coating material) coated onto the film bending portion (P2) into the pad of the bonding pad portion (P1) during a process of forming the coating layer 14.

The partition 15 has a predetermined height (or thickness) on one side of the bonding pad portion (P1) being in contact with the film bending portion (P2) so that it is possible to minimize the overflow of the insulating material (or coating material) coated onto the film bending portion (P2) into the pad of the bonding pad portion (P1). In one embodiment, the coating layer 14 is formed on one side of the partition 15 being in contact with the film bending portion (P2) so as to cover the boundary between the bonding pad portion (P1) and the film bending portion (P2), as shown in FIG. 2 wherein the coating layer 14 is formed on a top and side surface of the partition 15. For example, the coating layer 14 is provided to cover the entire area of the film bending portion (P2) and also to cover the boundary between the bonding pad portion (P1) and the film bending portion (P2). That is, the coating layer 14 is disposed to cover one side of the partition 15 being in contact with the film bending portion (P2) in accordance with an amount of the insulating material (or coating material) coated onto the film bending portion (P2). In the illustrated embodiment, the partition 15 extends from the first surface 11a of the base member 11, and more particularly, from the support plate 16 on the first circuit line layer 12a on the first surface 11a of the base member 11 between the bonding pad portion (P1) and the film bending portion (P2).

For convenience of manufacturing, the partition 15 according to one embodiment of the present disclosure is formed of the same material as that of the cover layer 13. More specifically, the partition 15 is formed of the same material as that of the first cover layer 13a of the cover layer 13, whereby the partition 15 and the first cover layer 13a may be manufacture by the same process and deposited at the same stage in the manufacturing flow using the same equipment.

The flexible circuit film 10 according to the present disclosure further includes the support plate 16, an electrostatic shielding layer 17, a conductive adhesion member 18, a metal plate 19, an adhesive sheet 20, a ground plate 21, a circuit protection layer 22, a heat emission layer 23, and a support member 24 (which may be referred to herein as a stiffener 24).

The support plate 16 covers the entire area of the first circuit line layer 12a of the circuit layer 12. In one embodiment, the support plate 16 has the same shape as that of the base member 11, and the support plate 16 is attached to the first circuit line layer 12a of the circuit layer 12 by the use of adhesive. In one embodiment, because the support plate 16 is attached to the first circuit line layer 12a by the use of adhesive, it has a dual-layered structure including the support plate 16 and the adhesive. However, the support plate 16 including the adhesive may also be referred to as one layer. The coating layer 14, the partition 15, and the first cover layer 13a of the cover layer 13 are on the support plate 16, as shown in FIG. 2.

The electrostatic shielding layer 17 is disposed on the first cover layer 13a of the cover layer 13 corresponding to the first, second, and third body portions P3a, P3b, and P3c. The electrostatic shielding layer 17 according to one embodiment of the present disclosure includes a conductive adhesive layer, a shield layer laminated on the conductive adhesive layer, and a protection layer laminated on the shield layer. The electrostatic shielding layer 17 is thus a multi-layer structure, although the electrostatic shielding layer 17 may also be referred to herein as one layer.

The conductive adhesive member 18 is disposed on the first cover layer 13a of the cover layer 13 corresponding to the circuit component mounting portion (P3d) of the body portion (P3). The conductive adhesive member 18 according to one embodiment of the present disclosure includes an isotropic conductive adhesive.

The metal plate 19 is disposed on the conductive adhesive member 18. The metal plate 19 according to one embodiment of the present disclosure includes a stainless material, and the metal plate 19 is electrically connected with the ground pad in the circuit component mounting portion (P3d) of the body portion (P3). The metal plate 19 reinforces a stiffness of the circuit component mounting portion (P3d), and also may serve a heat emission function. In other words, the metal plate 19 may be a heat sink for dissipation of heat through conduction of heat into the metal plate 19 and subsequent dissipation through convection.

The adhesive sheet 20 is disposed on the second cover layer 13b of the cover layer 13 to cover the second cover layer 13b. That is, the adhesive sheet 20 is disposed between the second cover layer 13b and the third circuit line layer 12c. In one embodiment, the adhesive sheet 20 is disposed between the second cover layer 13b and the third cover layer 13c. The adhesive sheet 20 is provided to laminate the second cover layer 13b and the third circuit line layer 12c to each other, and to laminate the second cover layer 13b and the third cover layer 13c to each other.

The ground plate 21 covers the entire area of the third circuit line layer 12c of the circuit layer 12. In this case, the ground plate 21 has the same shape as that of the third circuit line layer 12c, and the ground plate 21 is attached to the third circuit line layer 12c by the use of adhesive. In one embodiment, because the ground plate 21 is attached to the third circuit line layer 12c by the use of adhesive, it has a dual-layered structure. However, the ground plate 21 including the adhesive may also be referred to as one layer.

The circuit protection layer 22 is disposed on the ground plate 21 corresponding to the circuit component mounting portion (P3d) and the third body portion (P3c) of the body portion (P3). The circuit protection layer 22 according to one embodiment of the present disclosure includes photo imageable solder resist, which may have a green color, but is not limited to this type.

The heat emission layer 23 is disposed corresponding the first, second, and third body portions (P3a, P3b, P3c) of the body portion (P3). For example, the heat emission layer 23 covers the ground plate 21 corresponding to the first, second, and third body portions (P3a, P3b, P3c), the base member 11 corresponding to the first, second, and third body portions (P3a, P3b, P3c), and the circuit protection layer 22 corresponding to the third body portion (P3c). The heat emission layer 23 according to one embodiment of the present disclosure is formed of a material with a relatively high thermal conductivity. For example, the heat emission layer 23 may include a heat emission plate of argentum (silver or Ag), although other metals are expressly contemplated herein, such as aluminum, copper, gold, and alloys thereof, among others.

The stiffener 24 is disposed on the third cover layer 13c of the cover layer 13 corresponding to the connector portion (P4), to thereby reinforce a stiffness of the connector portion (P4). The stiffener 24 according to one embodiment of the present disclosure includes one or more of PET, PI, or epoxy.

In the flexible circuit film 10 according to one embodiment of the present disclosure, the thickness in at least some portions of the film bending portion (P2) is less than the thickness of the body portion (P3) so that it is possible to prevent the flexible circuit film 10 from being bent or broken during an assembly process, or to reduce a bending repulsive force of the flexible circuit film 10 when bent.

Figure 3:
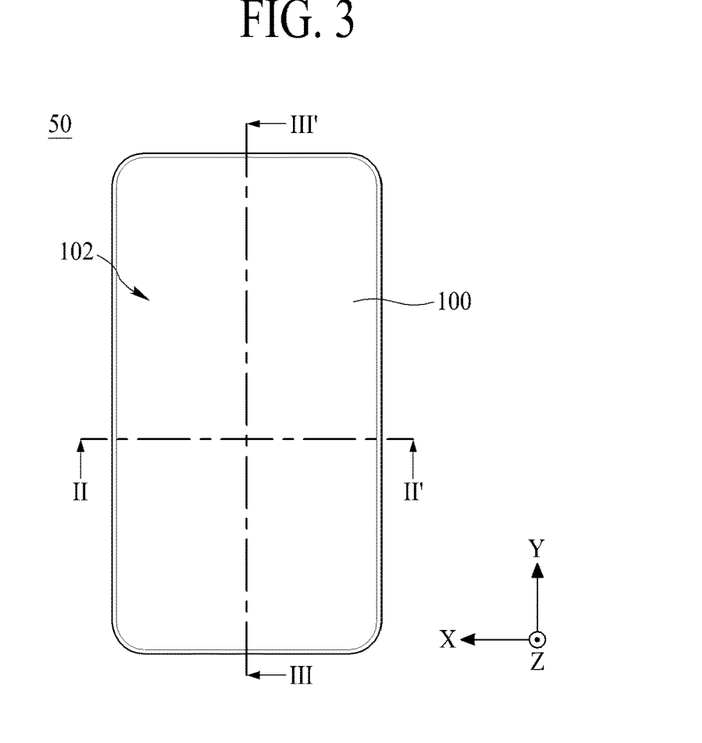
FIG. 3 is a plan view illustrating an electronic device according to one embodiment of the present disclosure.
Figure 4:
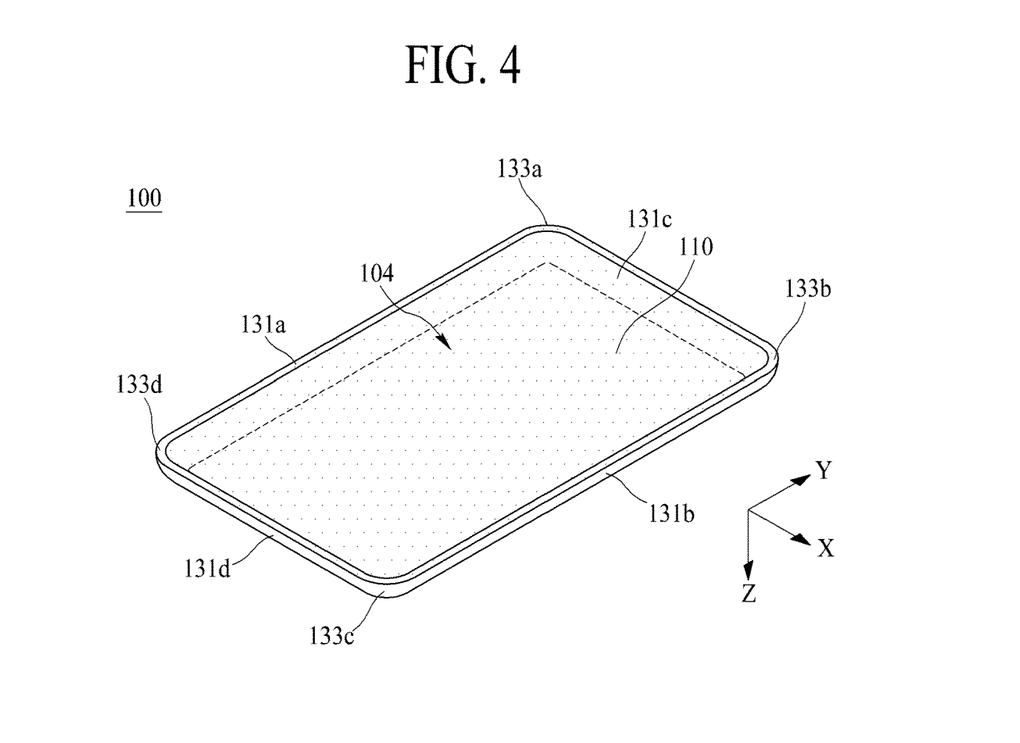
FIG. 4 illustrates a rear surface of a cover window of the electronic device shown in FIG. 3.
Figure 5:
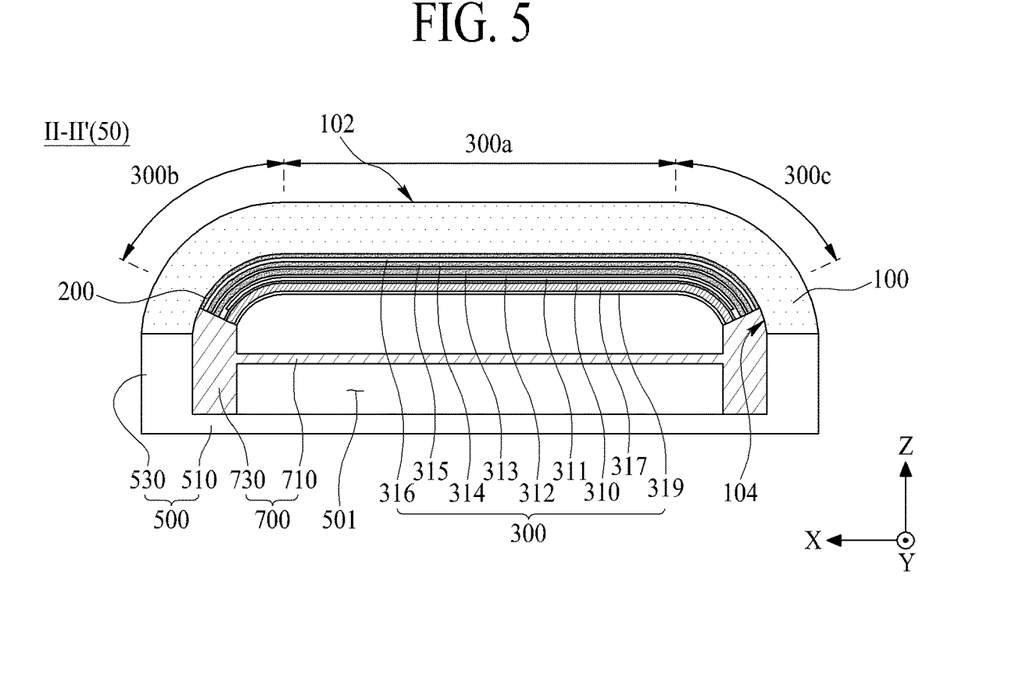
FIG. 5 is a cross-sectional view of the electronic device of FIG. 3 along II-II' in FIG. 3.
Figure 6:
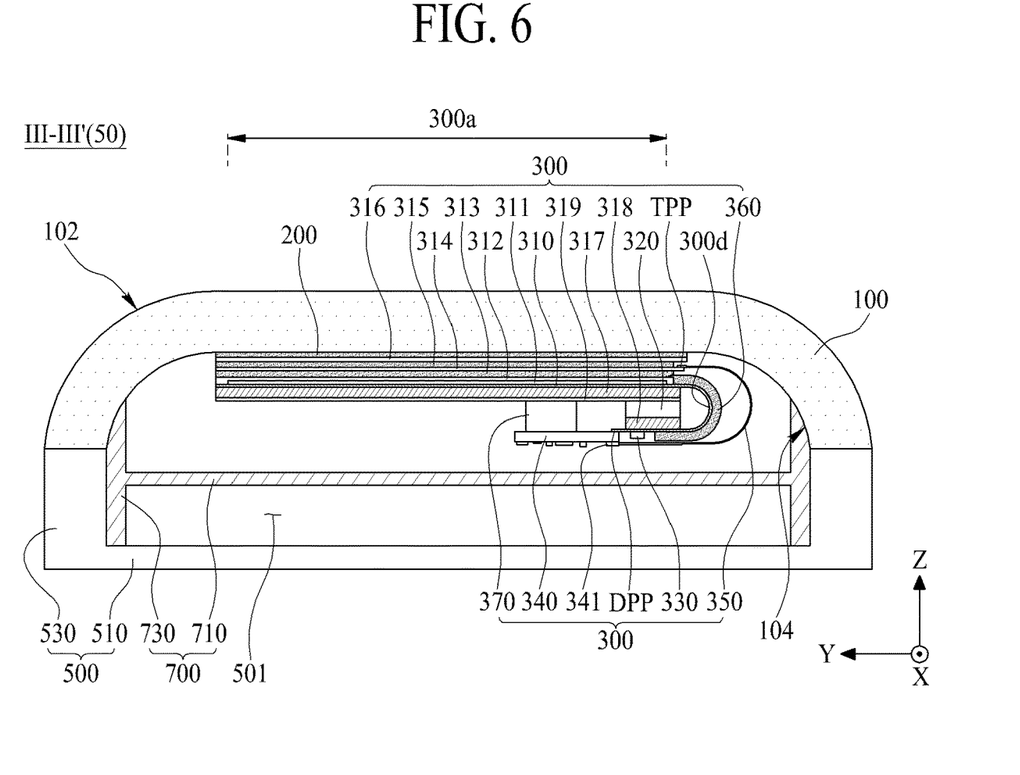
FIG. 6 is a cross-sectional view of the electronic device of FIG. 3 along III-III' in FIG. 3.

FIG. 3 is a plan view illustrating an electronic device 50 according to one embodiment of the present disclosure. FIG. 4 illustrates a rear surface of a cover window 100 shown in FIG. 3. FIG. 5 is a cross sectional view along II-II' of FIG. 3, and FIG. 6 is a cross sectional view along III-III' of FIG. 3. In FIGS. 3-6, a display module 300, a touch flexible circuit film 350, and a cover window 100 of the electronic device 50 may not be drawn to scale for convenience of explanation. As such, it is to be appreciated that the embodiments described with reference to FIGS. 3-6 are not limited to the scale shown in the drawings.

Referring to FIGS. 3-6, the electronic device 50 according to one embodiment of the present disclosure includes a cover window 100, a display module 300, and a housing 500, with the cover window 100 coupled to the housing 500 and the display module 300 disposed within the housing 500. The cover window 100 includes a first surface 102 (which may be referred to herein as a front surface 102) and a second surface 104 (which may be referred to herein as a rear surface 104) opposite the first surface 102.

The cover window 100 covers front and lateral surfaces of the display module 300, whereby the cover window 100 protects the display module 300 from an external shock or other external forces or contaminants.

The cover window 100 according to one or more embodiments of the present disclosure is formed of a transparent plastic material, a glass material, or a tempered glass material. For example, in various embodiments, the cover window 100 is formed of sapphire glass or gorilla glass, or may be formed in a deposition structure of a combination of sapphire glass and gorilla glass. According to another embodiment, the cover window 100 includes any one material among PET (polyethylene terephthalate), PC (polycarbonate), PES (polyether sulfone), PEN (polyethylene napthalate), and PNB (polynorbornene). To protect against scratching while maintaining transparency, the cover window 100 may be formed of tempered glass in an embodiment.

The cover window 100 according to one embodiment of the present disclosure includes: a first portion 110 (which may be referred to herein as a front portion 110); first, second, third, and fourth sidewall portions 131a, 131b, 131c and 131d which are bent from each edge of the front portion 110; and first, second, third, and fourth corner portions 133a, 133b, 133c and 133d, wherein each corner portion is bent between each of the first to fourth sidewall portions 131a, 131b, 131c and 131d, as shown in FIG. 4. In other words, each of the sidewall portions 131a, 131b, 131c, 131d extend from the front portion 110 and each of the corner portions 133a, 133b, 133c, 133d extend between corresponding ones of the sidewall portions 131a, 131b, 131c, 131d. In the illustrated embodiment, the front portion 110 is flat and planar, while the sidewall portions 131a, 131b, 131c, 131d and the corner portions 133a, 133b, 133c, 133d are curved.

The front portion 110 corresponds to a central portion of the cover window 100, wherein the front portion 110 is preferably transparent such that light passes through the front portion 110.

Each of the first to fourth sidewall portions 131a, 131b, 131c and 131d are bent in a curved-line shape with a predetermined radius of curvature from edges of the front portion 110. Thus, the edge of the front portion 110 may have the wholly curved structure.

The first and second sidewall portions 131a and 131b are disposed parallel to each other along a long side direction (Y) of the cover window 100. The first and second sidewall portions 131a and 131b preferably have the same radius of curvature, although in other embodiments, the first and second sidewall portions 131a and 131b have different radii of curvature.

The third and fourth sidewall portions 131c and 131d are disposed parallel to each other along a short side direction (X) of the cover window 100. The third and fourth sidewall portions 131c and 131d preferably have the same radius of curvature, while in other embodiments, the third and fourth sidewall portions 131c and 131d have different radii of curvature.

Each of the first to fourth corner portions 133a, 133b, 133c and 133d are formed in a curved-line shape between each of the sidewall portions 131a, 131b, 131c and 131d.

Since the cover window 100 has a curved 4-side structure, it is possible to realize a good design in the electronic device 50, and to reduce a bezel width in each of horizontal and vertical directions of the electronic device.

Additionally, the cover window 100 further includes a design layer (or decoration layer) prepared in the edge, in an embodiment. The design layer is printed at least one time on the edge of the rear surface 104 (or back surface) of the cover window 100 confronting the display module 300 so that it is possible to cover a non-display area of the display module 300 on which an image is not displayed in the electronic device 50.

The display module 300 is a display panel of a flat display device in one or more embodiments. For the following description, it is assumed that the display module 300 is a flexible light emitting display module, although other configurations are contemplated herein.

The display module 300 is connected with the rear surface 104 (or back surface) of the cover window 100, to thereby display an image or to sense a user's touch. The display module 300 is bonded to the rear surface 104 corresponding to the front portion 110 of the cover window 100 by a direct bonding process using a module bonding member 200. In one or more embodiments, the module bonding member 200 includes pressure sensitive adhesive (PSA), optical clear adhesive (OCA), or optical clear resin (OCR).

The display module 300 according to one embodiment of the present disclosure includes a display portion 300a, a first bending display portion 300b, and a second bending display portion 300c.

The display portion 300a enables display of an image on the front portion 110 of the cover window 100. The first bending display portion 300b, which is bent or curved from the first edge of the display portion 300a, enables display of an image on the curved surface in the first sidewall portion 131a of the cover window 100. The second bending display portion 300c, which is bent or curved from the second edge of the display portion 300a, enables display of an image on the curved surface in the second sidewall portion 131b of the cover window 100. It is possible to select which portions of the display module 300 and the electronic device 50 display images, and as such, in an embodiment, images are not displayed in the first bending display portion 300b and the second bending display portion 300c, or the first bending display portion 300b and the second bending display portion 3300c are omitted. In other embodiments, the display module 300 includes the display portion 300a and only one of the first and second bending display portions 300a, 300b.

The display module 300 according to one embodiment of the present disclosure includes a flexible substrate 310, a pixel array 311, a display pad portion (DPP), an encapsulation portion 312, a touch electrode portion 314, a touch pad portion (TPP), a functional film 316, a first back plate 317, a second back plate 318, a heat emission portion 319, a bending maintenance member 320, a driving integrated circuit 330, a printed circuit board 340, and a touch flexible circuit film 350.

The flexible substrate 310 is a base substrate of the display module 300, in an embodiment. The flexible substrate 310 according to one embodiment of the present disclosure includes a plastic material with flexibility, for example, any one among PI (polyimide), PET (polyethylene terephthalate), PC (polycarbonate), PES (polyether sulfone), PEN (polyethylene napthalate), PNB (polynorborneen), PMP (polymethylpentene), PMMA (poly methyl methacrylate), and COC (cycloolefin copolymer). More preferably, the flexible substrate 310 according to one embodiment of the present disclosure includes opaque or colored polyimide (PI). The flexible substrate 310 according to another embodiment of the present disclosure is formed in a thin film of a glass material having flexibility.

The pixel array 311 according to one embodiment of the present disclosure is disposed on the flexible substrate 310 in an area on the flexible substrate 310 corresponding to the display portion 300a, the first bending display portion 300b, and the second bending display portion 300c, whereby an image may be displayed on each of the display portion 300a, the first bending display portion 300b, and the second bending display portion 300c via the pixel array 311.

The pixel array 311 includes a plurality of pixels which are prepared in a pixel area defined by signal lines on the flexible substrate 310, and are configured to display an image in accordance with a signal supplied to the signal lines.

Each of the plurality of pixels includes a pixel circuit layer comprising a driving thin film transistor prepared in the pixel area, an anode electrode electrically connected with the driving thin film transistor, an emission device layer formed on the anode electrode, and a cathode electrode electrically connected with the emission device layer.

The driving thin film transistor is prepared in a transistor area of each pixel area defined on the flexible substrate 310, and the driving thin film transistor includes a gate electrode, a gate insulating film, a semiconductor layer, a source electrode, and a drain electrode. Herein, the semiconductor layer of the thin film transistor preferably includes silicon of a-Si, poly-Si, or low-temperature poly-Si type, or may include an oxide such as Indium-Gallium-Zinc-Oxide (IGZO), among others.

The anode electrode is prepared as a pattern shape in an opening area defined in each pixel area, and is electrically connected with the driving thin film transistor.

The emission device layer according to one embodiment of the present disclosure includes an organic light emitting device formed on the anode electrode. The organic light emitting device is formed in a deposition structure obtained by sequentially depositing a hole injecting layer, a hole transporting layer, an organic light emitting layer, an electron transporting layer, and an electron injecting layer. In one embodiment, it is possible to omit any one or two layers among the aforementioned hole injecting layer, the hole transporting layer, the electron transporting layer, and the electron injecting layer. The organic light emitting layer may be configured to emit the same colored light by each pixel, for example, white colored light by each pixel, or may be configured to emit different colored light by each pixel, for example, red colored light, green colored light, or blue colored light by each pixel.

The emission device layer according to one embodiment of the present disclosure includes a micro light emission diode device electrically connected with the anode electrode and the cathode electrode. The micro light emission diode device is a light emission diode realized in an integrated circuit (IC) or chip (Chip), wherein the micro light emission diode device includes a first terminal electrically connected with the anode electrode, and a second terminal electrically connected with the cathode electrode.

The cathode electrode is connected with an emission device of the emission device layer prepared for each pixel area.

The display pad portion (DPP) includes a plurality of pad electrodes prepared at one edge of the flexible substrate 310 which is spaced from one side of the pixel array 311. Each of the plurality of pad electrodes are electrically connected with the signal line of the pixel array 311 through a link line.

The encapsulation portion 312 is formed on the flexible substrate 310 and configured to surround the pixel array 311 so that it is possible to prevent oxygen or moisture from being permeated into the emission device layer of the pixel array 311. The encapsulation portion 312 according to one embodiment of the present disclosure is formed in a multi-layered structure obtained by alternately depositing an organic material layer and an inorganic material layer. Herein, the inorganic material layer prevents oxygen or moisture from being permeated into the emission device layer of the pixel array 311. In one or more embodiments, the organic material layer is formed with a thickness that is greater than a thickness of the inorganic material layer so that the organic material layer covers particles which might be generated during a manufacturing process. For example, the encapsulation portion 312 includes a first inorganic film, an organic film on the first inorganic film, and a second inorganic film on the organic film. The organic film may also be referred to herein as a particle cover layer.

The touch electrode portion 314 is disposed on the encapsulation portion 312, wherein the touch electrode portion 314 serves as a touch sensor capable of sensing a user's touch on the cover window 100.

The touch electrode portion 314 according to one embodiment of the present disclosure includes a touch electrode layer disposed on the encapsulation portion 312 on the pixel array 311, and a dielectric layer configured to cover the touch electrode layer. Selectively, the touch electrode portion 314 is provided on a touch buffer layer configured to cover the encapsulation portion 312. The touch electrode layer includes a plurality of touch driving electrodes disposed at fixed intervals on the encapsulation portion 312 on the pixel array 311, and a plurality of touch sensing electrodes electrically insulated from the touch driving electrodes. The touch sensing electrodes may be disposed in the same layer as the touch driving electrodes, or may be displayed in a different layer from the touch driving electrodes with the dielectric layer interposed in-between.

The touch electrode portion 314 according to another embodiment of the present disclosure may be substituted by a capacitive touch panel. In one embodiment, the touch panel is attached onto the encapsulation portion 312 by the use of a transparent adhesive member 313. The transparent adhesive member 313 may include pressure sensitive adhesive (PSA), optical clear adhesive (OCA), or optical clear resin (OCR), among others.

The touch pad portion (TPP) according to one embodiment of the present disclosure includes a plurality of touch pad electrodes which are disposed in one edge of the touch electrode portion 314 provided in one edge (or upper edge) of the flexible substrate 310 and are electrically connected with the touch electrode portion 314. The plurality of touch pad electrodes are connected with the touch sensing electrodes and touch driving electrodes through a plurality of touch routing lines in one-to-one correspondence. The touch pad portion (TPP) overlaps or covers the link line disposed on the flexible substrate 310. Selectively, the touch pad portion (TPP) may be disposed in one edge of the touch electrode portion 314 provided in one edge of the flexible substrate 310, and may be connected with the touch sensing electrodes and touch driving electrodes through the plurality of touch routing lines in one-to-one correspondence.

If the touch electrode portion 314 is substituted by the touch panel, the touch pad portion (TPP) is preferably disposed in one edge of the touch panel or the other edge of the touch panel, and is connected with the touch sensing electrodes and touch driving electrodes through the plurality of touch routing lines in one-to-one correspondence.

The functional film 316 is attached onto the touch electrode portion 314 by film adhesive member 315, and is attached to the cover window 100 by the use of module bonding member 200. In one or more embodiments, the film adhesive member 315 includes pressure sensitive adhesive (PSA), optical clear adhesive (OCA), or optical clear resin (OCR).

The functional film 316 according to one embodiment of the present disclosure includes a reflection preventing layer (or reflection preventing film) configured to prevent a reflection of ambient light so as to improve contrast ratio and outdoor visibility for an image displayed on the display module 300 of the electronic device 50. For example, the reflection preventing layer includes a circular polarizing layer (or circular polarizing film) configured to prevent ambient light incident on the cover window 100 from being reflected on the thin film transistor and/or lines disposed in the pixel array 311 and being advanced toward the cover window 100.

The functional film 316 further includes a barrier layer (or barrier film) configured to prevent a permeation of moisture or oxygen, wherein the barrier layer is formed of a material with low moisture permeation, for example, polymer.

The functional film 316 further includes a light path control layer (or light path control film) configured to control a path of light emitted from the pixel array 311 to the cover window 100. The light path control layer has a deposition structure obtained by alternately depositing a high refraction layer and a low refraction layer, whereby a path of light being provided from the pixel array 311 may be changed, to thereby minimize a color shift in accordance with a viewing angle.

In one or more embodiments, the functional film 316 is disposed between the touch electrode portion 314 and the encapsulation portion 312. In one embodiment, the touch electrode portion 314 is attached to the cover window 100 by the use of module bonding member 200.

The first back plate 317 is attached to the rear surface (or back surface) of the flexible substrate 310 corresponding to the pixel array 311, whereby the rear surface (or back surface) of the flexible substrate 310 corresponding to the pixel array 311 is maintained in a planar state.

The second back plate 318 is attached to one edge of the rear surface (or back surface) of the flexible substrate 310 corresponding to the display pad portion (DPP), whereby the one edge of the rear surface (or back surface) of the flexible substrate 310 is maintained in a planar state.

A link line area of the flexible substrate 310, which is provided with link lines while corresponding to an open portion between the first back plate 317 and the second back plate 318, is defined as the panel bending area which is bent with a predetermined radius of curvature. That is, the panel bending area of the flexible substrate 310 is not supported in a planar state by the first back plate 317 and the second back plate 318, in an embodiment, such that the panel bending area of the flexible substrate 310 may be freely bent. Accordingly, the panel bending area of the flexible substrate 310 is bent to surround one lateral surface of the first back plate 317 facing the second back plate 318, whereby the display pad portion (DPP) overlaps with one rear edge of the first back plate 317. Thus, the flexible display module 300 is bent at a selected radius of curvature in the panel bending area of the flexible substrate 310, to thereby realize a small bezel width.

The heat emission portion 319 is attached to the rear surface (or back surface) of the first back plate 317, whereby heat generated in the pixel array 311 is transferred to the heat emission portion 319 and dissipated thereby.

The conductive heat emission portion 319 includes a heat emission member, a cushion member, and an adhesive member.

The heat emission member includes a material with a relatively high thermal conductivity. The heat emission member according to one embodiment of the present disclosure includes a metal layer of copper (Cu), and a graphite layer coated onto the metal layer. The heat emission member provides a heat emission function, a ground function, and a protection function for protecting the rear surface of the display module 300.

The cushion member includes a foam tape or foam pad connected to or coupled to the heat emission member. The cushion member is configured absorb a shock incident on the display module 300, for example.

The adhesive member is connected with or coupled to the cushion member. The adhesive member includes an uneven surface structure (or embossing structure) formed in its surface. The uneven surface structure of the adhesive member prevents bubbles from being generated between the first back plate 317 and the heat emission member 319 during an attachment process between the first back plate 317 and the heat emission portion 319 so that it is possible to omit a deformation process for removing bubbles generated between the first back plate 317 and the heat emission portion 319, which increases manufacturing efficiency.

The bending maintenance member 320 is disposed between the first back plate 317 and the second back plate 318. In the illustrated embodiment, the first back plate 317 and the second back plate 318 are aligned in a thickness direction (Z) of the display module 300 such that the first black plate 317 faces the second back plate 318 as a result of bending of the panel bending area of the flexible substrate 310. The bending maintenance member 320 fixes the second back plate 318 disposed in the rear surface of the first back plate 317 to one rear edge of the first back plate 317 in accordance with the bending of the flexible substrate 310 so as to maintain the bending state and bending shape of the flexible substrate 310.

The bending maintenance member 320 according to one or more embodiments of the present disclosure includes a bar-shaped metal material, a plastic-based structure, or a double-sided tape.

One surface (or front surface) of the bending maintenance member 320 is attached to the heat emission layer of the heat emission portion 319, or is attached to the first back plate 317 from which some portions of the heat emission portion 319 are removed. And, the other surface (or rear surface) of the bending maintenance member 320 is attached to the second back plate 318.

If one surface of the bending maintenance member 320 is attached to the first back plate 317, a thickness of the display module 300 is reduced. And, if one surface of the bending maintenance member 320 is directly attached to the heat emission member of the heat emission portion 319, it is possible to reduce a bending repulsive force by the panel bending area 300d of the flexible substrate 310 due to the increased distance between the first back plate 317 and the second back plate 318.

The driving integrated circuit 330 is mounted on a circuit mounting area defined on the flexible substrate 310 by a chip bonding process or surface mounting process. The driving integrated circuit 330 is electrically connected with the display pad portion (DPP), and may be electrically connected with the pixel array 311 through the link line. The driving integrated circuit 330 generates a data signal and a gate signal on the basis of timing synchronized signal and video data supplied from a host driving circuit through the printed circuit board 340 so as to display an image in each pixel disposed in the pixel array 311. The driving integrated circuit 330 is disposed on the flexible substrate 310 in an area corresponding to the bending maintenance member 320, in an embodiment.

The printed circuit board 340 is electrically connected to the display pad portion (DPP) in the flexible substrate 310 by a film attachment process, and is disposed overlapped with the first back plate 317 by the bending of the flexible substrate 310. In other words, the printed circuit board 340 faces the first back plate 317 due to bending of the flexible substrate 310. The printed circuit board 340 provides the video data and timing synchronized signal, supplied from the host driving circuit, to the driving integrated circuit through the display pad portion (DPP), and in an embodiment, may provide voltages which are necessary for driving the pixel array 311 and/or the driving integrated circuit 330.

The touch flexible circuit film 350 is electrically connected to the touch pad portion (TPP) in the display module 300 by a film attachment process, and in an embodiment, may be electrically connected to the printed circuit board 340. The touch flexible circuit film 350 supplies a touch driving signal, which is provided from the printed circuit board 340, to the touch electrodes through the touch pad portion (TPP), and in an embodiment, may supply a signal corresponding to a capacitance change in the touch electrodes to the printed circuit board 340 through the touch pad portion (TPP).

The touch flexible circuit film 350 according to one embodiment of the present disclosure has the same structure as that of the flexible circuit film 10 shown in FIGS. 1 and 2, whereby a detailed repetitive description for the same parts will be omitted. In this case, referring to FIGS. 1 to 5, the bonding pad portion (P1) of the touch flexible circuit film 350 is bonded to the touch pad portion (TPP) prepared in the display module 300 by a film attachment process using an anisotropic conductive film. The film bending portion (P2) of the touch flexible circuit film 350 is bent to surround the panel bending area 300d of the flexible substrate 310. And, the connector portion (P4) of the touch flexible circuit film 350 is connected with a touch connector 341 mounted on the printed circuit board 340. Thus, the thickness in at least some portions of the film bending portion (P2) of the touch flexible circuit film 350 is less than the thickness of the body portion (P3), so that it is possible to prevent the touch flexible circuit film 350 from being bent or broken by an interference with the cover window 100 during an assembly process, or to reduce a bending repulsive force of the film bending portion (P2). The reduction in thickness also facilitates the bending of the film bending portion (P2), and it prevents formation of uneven surface portions of the film bending portion (P2) due to the bending repulsive force of the film bending portion (P2).

The display module 300 according to the present disclosure further includes a micro cover layer 360 configured to cover the panel bending area 300d of the flexible substrate 310.

The micro cover layer 360 covers the panel bending area 300d of the flexible substrate 310 disposed between the encapsulation portion 312 and the driving integrated circuit 330.

The micro cover layer 360 includes a polymer material, wherein the micro cover layer 360 is coated on to the panel bending area 300d of the flexible substrate 310 so as to cover the link line between the encapsulation portion 312 and the driving integrated circuit 330. The micro cover layer 360 protects the link line from external shock, and also prevents moisture permeation into the link line. Especially, when the panel bending area 300d of the flexible substrate 310 is bent in a curved-line shape with a predetermined radius of curvature, the micro cover layer 360 is provided to position the link line on a neutral plane. That is, when the panel bending area 300d of the flexible substrate 310 is bent with a predetermined radius of curvature, the neutral plane, in which each of a tensile force and a compressive force becomes '0' (zero), exists between the flexible substrate 310 and the micro cover layer 360. Accordingly, the micro cover layer 360 includes a material whose elastic coefficient is higher than that of the flexible substrate 310 so that the link lines are positioned in the neutral plane. Thus, the link lines are positioned in the neutral plane between the micro cover layer 360 and the flexible substrate 310. That is, when the panel bending area 300d of the flexible substrate 310 is bent in a curved-line shape, a bending stress of '0' (zero) is applied to the link lines positioned in the neutral line between the micro cover layer 360 and the flexible substrate 310, whereby the link lines may be bent without any damage caused by the bending stress.

The display module 300 according to the present disclosure further includes a PCB fixation member 370 configured to fix the printed circuit board 340 to the heat emission portion 319.

The PCB fixation member 370 includes a double-sided tape or double-sided foam tape. The PCB fixation member 370 is interposed between the printed circuit board 340 and the heat emission portion 319, whereby the printed circuit board 340 is attached to the heat emission portion 319 by the use of PCB fixation member 370.

Additionally, the PCB fixation member 370 may include a conductive double-sided tape comprising a conductive layer. in this case, the PCB fixation member 370 electrically connects the ground terminal prepared in the printed circuit board 340 with the heat emission member of the heat emission portion 319, whereby electrostatic introduced to the printed circuit board 340 may be discharged to the heat emission portion 319.

The housing 500 receives the display module 300, and supports the cover window 100. For example, the housing 500 is connected with the first to fourth sidewall portions 131a, 131b, 131c and 131d, to thereby support the cover window 100.

The housing 500 according to one embodiment of the present disclosure includes a rear cover 510 configured to cover the rear surface of the display module 300. A circuit receiving space 501 is provided between the rear cover 510 and the housing 500. The housing 500 further includes a lateral cover 530 to support the cover window 100.

The rear cover 510 is disposed as the outermost rear surface of the electronic device 50, wherein the rear cover 510 may include a plastic material, a metal material, or a glass material. For example, the rear cover 510 includes a glass material with a color coating layer, in an embodiment.

The lateral cover 530 according to one embodiment of the present disclosure is disposed as the outermost lateral surface of the electronic device 50, wherein the lateral cover 530 is bent from the edge of the rear cover 510 and connected with the first to fourth sidewall portions 131a, 131b, 131c and 131d of the cover window 100.

The lateral cover 530 according to another embodiment of the present disclosure is formed of a plastic material, a metal material, or a glass material, and is disposed between the rear cover 510 and the first to fourth sidewall portions 131a, 131b, 131c and 131d of the cover window 100.

The circuit receiving space 501 is between the rear surface of the display module 300 and the rear cover 510, wherein the host driving circuit, memory and battery may be received in the circuit receiving space 501.

The electronic device according to one embodiment of the present disclosure further includes a middle frame 700.

The middle frame 700 is disposed in the circuit receiving space 501 of the housing 500, and the middle frame 700 supports circuit components disposed in the circuit receiving space 501. The middle frame 700 may also support the cover window 100. The middle frame 700 according to one embodiment of the present disclosure includes a middle plate 710 and a middle sidewall 730.

The middle plate 710, which is disposed between the rear surface of the display module 300 and the rear cover 510, supports the circuit components disposed in the circuit receiving space 501.

The middle sidewall 730, which is vertically connected with a lateral surface of the middle plate 710, supports the first to fourth sidewall portions 131a, 131b, 131c and 131d of the cover window 100.

Selectively, the lateral cover 530 of the housing 500 may be substituted by the middle sidewall 730 of the middle frame 700. In such an embodiment, the middle sidewall 730 of the middle frame 700 is disposed between the edge of the rear cover 510 and the first to fourth sidewall portions 131a, 131b, 131c and 131d of the cover window 100, whereby it is possible to omit the lateral cover 530 of the housing 500.

Figure 7:
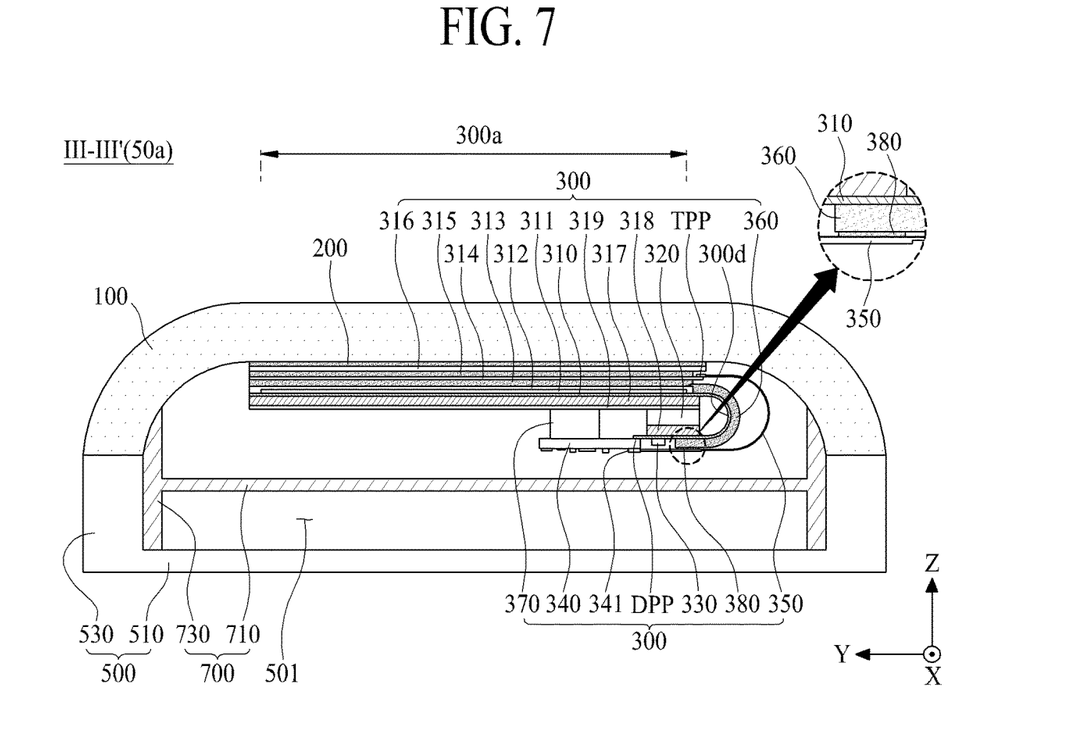
FIG. 7 is a cross-sectional view of an alternative embodiment of an electronic device according to the present disclosure.

In an alternative embodiment of an electronic device 50a according to the present disclosure, the display module 300 further includes a circuit film fixation member 380, as shown in FIG. 7.

The circuit film fixation member 380 is interposed between the touch flexible circuit film 350 and the micro cover layer 360 overlapped with the second back plate 318. That is, one surface of the circuit film fixation member 380 is attached to the micro cover layer 360 overlapped with the second back plate 318. And, one surface of the circuit film fixation member 380 is attached to the body portion of the touch flexible circuit film 350 overlapped with the second back plate 318. The circuit film fixation member 380 fixes the body portion of the touch flexible circuit film 350 in the bent state to the micro cover layer 360 so that it is possible to thoroughly prevent the uneven surface portions of the touch flexible circuit film 350 from forming due to the bending repulsive force of the touch flexible circuit film 350 in the bent state. The circuit film fixation member 380 according to one embodiment of the present disclosure includes a double-sided tape or double-sided foam tape.

Figure 8A:
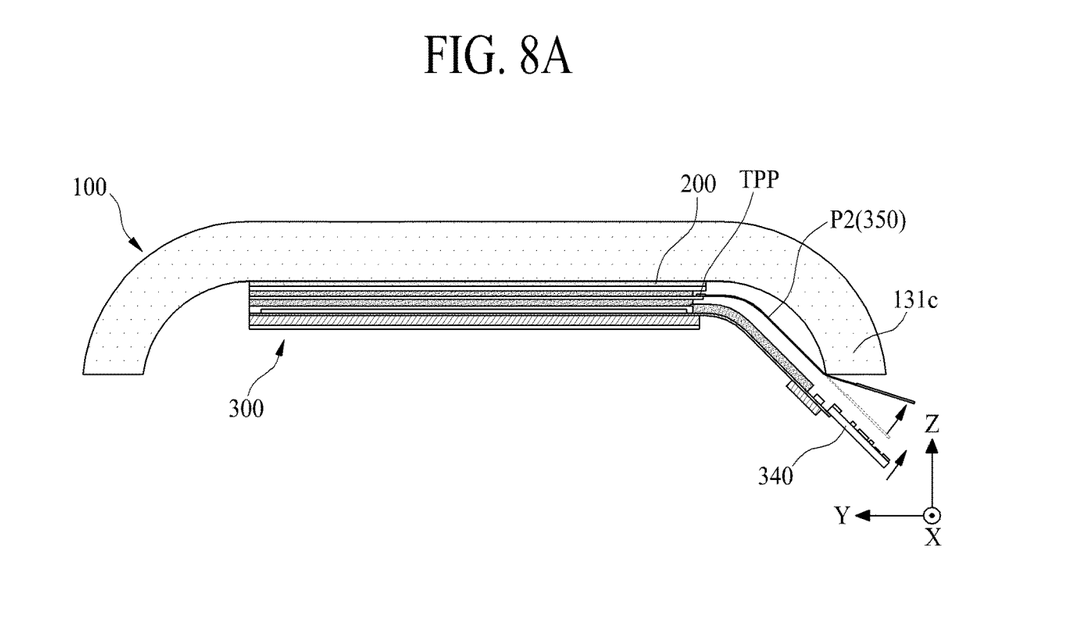
FIGS. 8A-8C illustrate a bonding process of a cover window and a display module, and a bending process of the display module in an electronic device according to one embodiment of the present disclosure.
Figure 8B:
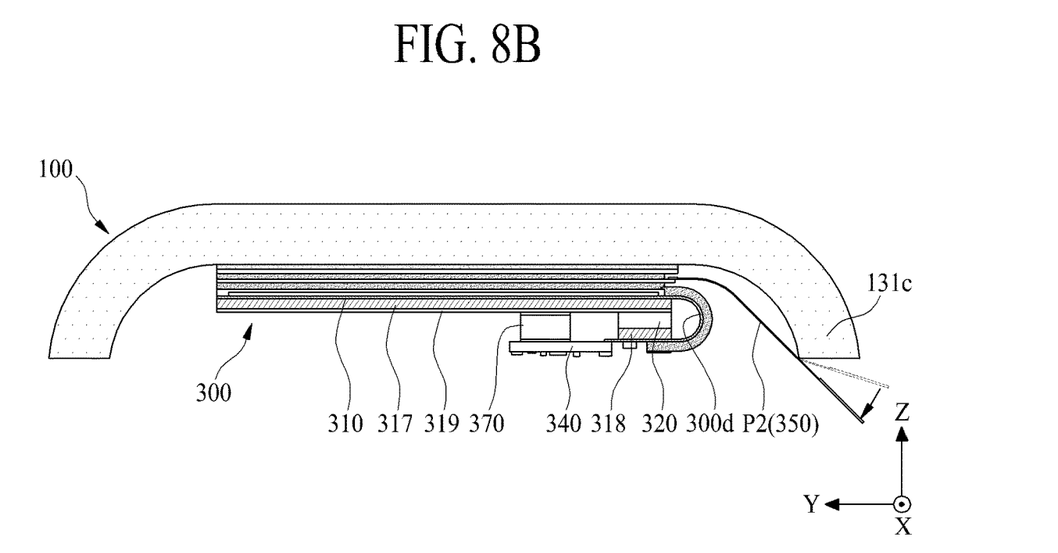
Figure 8C:
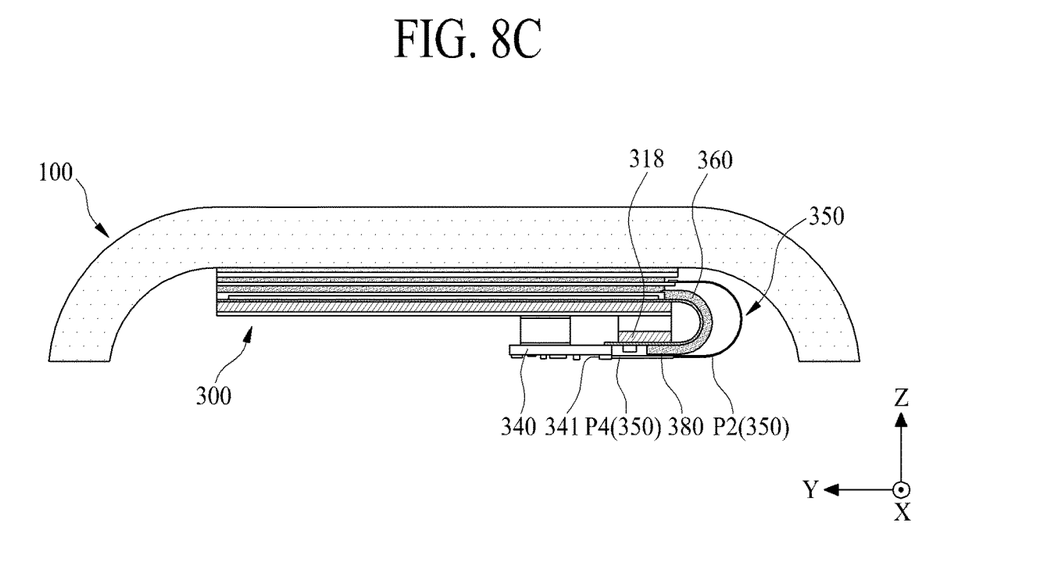

FIGS. 8A to 8C illustrate the bonding process between the cover window 100 and the display module 300 and the bending process of the display module 300 in the electronic devices 50, 50a according to one embodiment of the present disclosure.

First, as shown in FIG. 8A, the module bonding member 200 is attached to the front surface of the display module 300, and the display module 300 is attached to the rear surface of the front portion of the cover window 100 through the direct bonding process using the module bonding member 200. In one embodiment, the touch flexible circuit film 350 attached to the touch pad portion (TPP) of the display module 300 may be in physical contact with the sidewall portion 131c of the cover window 100 in accordance with the bending repulsive force of the film bending portion (P2) and interference with the printed circuit board 340, whereby an abnormally bent or broken portion (or forcibly bent or broken portion) is generated in the film bending portion (P2). However, in case of the touch flexible circuit film 350 according to the present disclosure, at least some portions of the film bending portion (P2) are freely bent without being forcibly bent even though there is physical contact between the film bending portion (P2) and the sidewall portion 131c of the cover window 100. That is, because the thickness in at least some portions of the film bending portion (P2) in physical contact with the sidewall portion 131c of the cover window 100 is less than the thickness of the body portion, at least some portions of the film bending portion (P2) may be normally bent without being forcibly bent by the physical contact between the film bending portion (P2) and the sidewall portion 131c of the cover window 100, whereby defects such as cracks, which are caused by the forcible bending of the touch flexible circuit 350 for the direct bonding process, are not generated.

Then, as shown in FIG. 8B, each of the bending maintenance member 320 and the PCB fixation member 370 are attached to the heat emission portion 319 of the display module 300. Thereafter, once the panel bending area 300d of the flexible substrate 310 of the display module 300 is bent in the curved-line shape, the second back plate 318 of the display module 300 is attached to the bending maintenance member 320, and the printed circuit board 340 is attached to the PCB fixation member 370. In one embodiment, the touch flexible circuit film 350 being in the bent state may be bent to its original position in accordance with the release of the interference with the printed circuit board 340, and the touch flexible circuit film 350 is maintained in contact with the sidewall portion 131c of the cover window 100 by the bending repulsive force of the film bending portion (P2).

Then, as shown in FIG. 8C, once the touch flexible circuit film 350 is bent, the connector portion (P4) of the touch flexible circuit film 350 is connected with the connector 341 of the printed circuit board 340. In this case, the thickness in at least some portions of the film bending portion (P2) of the touch flexible circuit film 350 in contact with the connector 341 of the printed circuit board 340 is less so that it is possible to reduce the bending repulsive force, to thereby prevent or minimize formation of uneven surface portions.

Selectively, before the contact process between the touch flexible circuit film 350 and the printed circuit board 340, the circuit film fixation member 380 is attached to the micro cover layer 360 overlapped with the second back plate 318. Then, once the touch flexible circuit film 350 is bent, the connector portion (P4) of the touch flexible circuit film 350 is connected with the connector 341 of the printed circuit board 340. In this case, the connector portion (P4) of the touch flexible circuit film 350 is fixed to the micro cover layer 360 so that it is possible to prevent uneven surface portions of the touch flexible circuit film 350 from forming.

As described above, the electronic devices 50, 50a according to one or more embodiments of the present disclosure include the touch flexible circuit film 350 so that it is possible to prevent the touch flexible circuit film 350 from being damaged by the bending of the touch flexible circuit film 350 during the bonding process between the display module 300 and the cover window 100, and to prevent uneven surface portions of the touch flexible circuit film 350 forming due to the bending repulsive force of the touch flexible circuit film 350 in the bent state.

Meanwhile, in the electronic device according to the present disclosure, the display module 300 corresponds to a flexible light emitting display module, but not limited to this type. The display module 300 may be any one of flexible display modules generally known to those in the art, for example, a flexible liquid crystal display module or a flexible electrophoresis display module.

The electronic devices 50, 50a and components or features thereof according to the present disclosure may be applied to a tablet personal computer, a smart watch, a smart watch, a wearable device, an electronic notebook, an electronic book, a portable multimedia player, a navigation device, a television, a notebook, a monitor, a camera, a camcorder, or home appliances in addition to a smart phone, a mobile communication terminal, or a mobile phone.

The flexible circuit film according to one or more embodiments of the present disclosure may be explained as follows.

According to an embodiment of the present disclosure, a flexible circuit film comprises: a bonding pad portion; a body portion; and a film bending portion positioned between the bonding pad portion and the body portion, wherein at a portion of the film bending portion has a thickness that is less than a thickness of the body portion.

According to one or more embodiments of the present disclosure, each of the bonding pad portion, the film bending portion and the body portion includes a plurality of layers, and a number of layers of the plurality of layers included in the portion of the film bending portion is less than a number of layers included in the plurality of layers of the body portion.

According to one or more embodiments of the present disclosure, the number of layers of the plurality of layers included in the portion of the film bending portion is equal to or less than four layers, and the number of layers of the plurality of layers of the body portion is greater than or equal to five layers.

According to one or more embodiments of the present disclosure, the flexible circuit film further includes: a base member including the bonding pad portion, the film bending portion and the body portion; a circuit line layer disposed on the base member in each of the bonding pad portion, the film bending portion and the body portion; a cover layer on the circuit line layer disposed on the body portion; and a coating layer on the circuit line layer disposed on at least the portion of the film bending portion, wherein a thickness of the coating layer is less than a thickness of the cover layer.

According to one or more embodiments of the present disclosure, the thickness of the coating layer is greater than or equal to 5 micrometers.

According to one or more embodiments of the present disclosure, a first height from a front surface of the base member to an uppermost surface of the coating layer is less than a second height from the front surface of the base member to an uppermost surface of the cover layer.

According to one or more embodiments of the present disclosure, the coating layer includes a polymer material or a solder resist material.

According to one or more embodiments of the present disclosure, the flexible circuit film further includes: a partition disposed on one side of the bonding pad portion of the base member and proximate the film bending portion, wherein the coating layer covers one side of the partition proximate the film bending portion.

According to one or more embodiments of the present disclosure, the partition is formed of a material and the cover layer is formed of the same material.

According to the embodiment of the present disclosure, an electronic device comprises: a cover window; and a display module connected to the cover window, wherein the display module includes a touch flexible circuit film bonded to a touch pad portion, the touch flexible circuit film including a flexible circuit film, the flexible circuit film including: a bonding pad portion having a first thickness; a body portion having a second thickness; and a film bending portion positioned between the bonding pad portion and the body portion, wherein at a portion of the film bending portion has a third thickness that is less than the second thickness of the body portion.

According to one or more embodiments of the present disclosure, the cover window further includes: a front portion configured to cover a front surface of the display module; and a sidewall portion extending from an edge of the front portion and configured to cover each lateral surface of the display module.

According to one or more embodiments of the present disclosure, the sidewall portion is bent from the edge of the front portion.

According to one or more embodiments of the present disclosure, the display module further includes: a flexible substrate including a display portion, a panel bending area in a bent configuration, and a display pad portion facing the display portion; a pixel array disposed on the display portion; a touch electrode portion disposed on the pixel array; and a printed circuit board electrically connected to the display pad portion and electrically connected to the touch flexible circuit film, wherein the touch pad portion is disposed proximate one edge of the touch electrode portion, and is electrically connected to the touch electrode portion.

According to one or more embodiments of the present disclosure, the display module further includes: a first back plate attached to a rear surface of the flexible substrate; a second back plate attached to the rear surface of the flexible substrate, the second back plate facing the first back plate; and a bending maintenance member disposed between the first back plate and the second back plate, wherein the touch flexible circuit film is bent around a portion of the first back plate, the bending maintenance member and the second back plate, and is coupled to a connector mounted on the printed circuit board.

According to one or more embodiments of the present disclosure, the electronic device further includes: a circuit film fixation member disposed between the touch flexible circuit film and a micro cover layer on the film bending portion of the flexible circuit film, wherein the touch flexible circuit film is fixed to the micro cover layer by the circuit film fixation member.

According to one or more embodiments of the present disclosure, the electronic device further includes: a heat emission portion attached to a rear surface of the first back plate, wherein the bending maintenance member is disposed between the heat emission portion and the second back plate.

According to one or more embodiments of the present disclosure, the bending maintenance member is a double-sided tape.

According to one or more embodiments of the present disclosure, the electronic device further includes: a heat emission portion attached to a rear surface of the first back plate, and a printed circuit board fixation member on the printed circuit board and configured to fix the printed circuit board to the heat emission portion.

According to one or more embodiments of the present disclosure, the printed circuit board fixation member includes a conductive layer.

According to one or more embodiments of the present disclosure, the bending maintenance member is disposed between the heat emission portion and the second back plate.

In addition to the effects and advantages of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosure. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flexible circuit film, comprising:
a bonding pad portion;
a body portion;
a film bending portion positioned between the bonding pad portion and the body portion;
a base member including the bonding pad portion, the film bending portion, and the body portion;
a circuit line layer disposed on the base member in each of the bonding pad portion, the film bending portion, and the body portion;
a cover layer on the circuit line layer disposed on the body portion; and
a coating layer on the circuit line layer disposed on at least the portion of the film bending portion,
wherein at least a portion of the film bending portion has a thickness that is less than a thickness of the body portion,
wherein a thickness of the coating layer is less than a thickness of the cover layer, and
wherein a first height from a front surface of the base member to an uppermost surface of the coating layer is less than a second height from the front surface of the base member to an uppermost surface of the cover layer.

2. The flexible circuit film according to claim 1,
wherein each of the bonding pad portion, the film bending portion and the body portion includes a plurality of layers, and
a number of layers of the plurality of layers included in the portion of the film bending portion is less than a number of layers in the plurality of layers of the body portion.

3. The flexible circuit film according to claim 2,
wherein the number of layers of the plurality of layers included in the portion of the film bending portion is equal to or less than four layers, and
the number of layers of the plurality of layers of the body portion is greater than or equal to five layers.

4. The flexible circuit film according to claim 1, wherein the thickness of the coating layer is greater than or equal to 5 micrometers.

5. The flexible circuit film according to claim 1, wherein the coating layer includes a polymer material or a solder resist material.

6. The flexible circuit film according to claim 1, further comprising:
a partition disposed on one side of the bonding pad portion of the base member and proximate the film bending portion,
wherein the coating layer covers one side of the partition proximate the film bending portion.

7. The flexible circuit film according to claim 6, wherein the partition is formed of a material and the cover layer is formed of the same material.

8. An electronic device comprising:
a cover window; and
a display module connected to the cover window, wherein the display module includes a touch flexible circuit film bonded to a touch pad portion, the touch flexible circuit film including a flexible circuit film,
wherein the flexible circuit film includes:
a bonding pad portion having a first thickness;
a body portion having a second thickness;
a film bending portion positioned between the bonding pad portion and the body portion;
a base member including the bonding pad portion, the film bending portion, and the body portion;
a circuit line layer disposed on the base member in each of the bonding pad portion, the film bending portion, and the body portion;
a cover layer on the circuit line layer disposed on the body portion; and
a coating layer on the circuit line layer disposed on at least the portion of the film bending portion,
wherein at least a portion of the film bending portion has a third thickness that is less than the second thickness of the body portion,
wherein a thickness of the coating layer is less than a thickness of the cover layer, and
wherein a first height from a front surface of the base member to an uppermost surface of the coating layer is less than a second height from the front surface of the base member to an uppermost surface of the cover layer.

9. The electronic device according to claim 8, wherein the cover window includes:
a front portion configured to cover a front surface of the display module; and
a sidewall portion extending from an edge of the front portion and configured to cover each lateral surface of the display module.

10. The electronic device according to claim 9, wherein the sidewall portion is bent from the edge of the front portion.

11. The electronic device according to claim 9, wherein the display module includes:
a flexible substrate including a display portion, a panel bending area in a bent configuration, and a display pad portion facing the display portion;
a pixel array disposed on the display portion;
a touch electrode portion disposed on the pixel array; and
a printed circuit board electrically connected to the display pad portion and electrically connected to the touch flexible circuit film,
wherein the touch pad portion is disposed proximate one edge of the touch electrode portion, and is electrically connected to the touch electrode portion.

12. The electronic device according to claim 11, wherein the display module further includes:
a first back plate attached to a rear surface of the flexible substrate;
a second back plate attached to the rear surface of the flexible substrate, the second back plate facing the first back plate; and
a bending maintenance member disposed between the first back plate and the second back plate,
wherein the touch flexible circuit film is bent around a portion of the first back plate, the bending maintenance member and the second back plate, and is coupled to a connector mounted on the printed circuit board.

13. The electronic device according to claim 12, further comprising:
a circuit film fixation member disposed between the touch flexible circuit film and a micro cover layer on the film bending portion of the flexible circuit film,
wherein the touch flexible circuit film is fixed to the micro cover layer by the circuit film fixation member.

14. The electronic device according to claim 12, further comprising a heat emission portion attached to a rear surface of the first back plate,
wherein the bending maintenance member is disposed between the heat emission portion and the second back plate.

15. The electronic device according to claim 14, wherein the bending maintenance member is a double-sided tape.

16. The electronic device according to claim 12, further comprising:
a heat emission portion attached to a rear surface of the first back plate; and
a printed circuit board fixation member on the printed circuit board and configured to fix the printed circuit board to the heat emission portion.

17. The electronic device according to claim 16, wherein the printed circuit board fixation member includes a conductive layer.

18. The electronic device according to claim 16, wherein the bending maintenance member is disposed between the heat emission portion and the second back plate.

* * * * *